United States Patent [19]
Fazan et al.

[11] Patent Number: 5,236,860
[45] Date of Patent: Aug. 17, 1993

[54] LATERAL EXTENSION STACKED CAPACITOR

[75] Inventors: Pierre Fazan; Gurtej S. Sandhu; Hiang C. Chan; Yauh-Ching Liu, all of Boise, Id.

[73] Assignee: Micron Technology, Inc., Boise, Id.

[21] Appl. No.: 799,461

[22] Filed: Nov. 26, 1991

Related U.S. Application Data

[63] Continuation-in-part of Ser. No. 637,900, Jan. 4, 1991, abandoned.

[51] Int. Cl.$^5$ .................... H01L 21/70; H01L 27/00
[52] U.S. Cl. ........................ 437/52; 437/47; 437/60; 437/233
[58] Field of Search .............. 437/47, 52, 60, 919; 357/23.5; 365/149

[56] References Cited

U.S. PATENT DOCUMENTS

| | | | |
|---|---|---|---|
| 4,742,018 | 5/1988 | Kimura et al. | 437/48 |
| 5,049,517 | 9/1991 | Liu et al. | 437/47 |
| 5,071,781 | 12/1991 | Slo et al. | 437/52 |
| 5,100,825 | 3/1992 | Fatan et al. | 437/52 |
| 5,118,640 | 6/1992 | Fujii et al. | 437/52 |

OTHER PUBLICATIONS

"3-Dimensional Stacked Capacitor Cell For 16M and 64M DRAMs" by T. Ema et al., IEDM 88, pp. 592–595 (1988).

"A Spread Stacked Capacitor (SCC) for 64BIT DRAMs" by S. Inoue et al., IEEE 89, pp. 2.3.1–2.3.4 (1989).

Primary Examiner—Olik Chaudhuri
Assistant Examiner—H. Jey Tsai
Attorney, Agent, or Firm—David J. Paul

[57] ABSTRACT

A lateral extension stacked capacitor (LESC) using a modified stacked capacitor storage cell fabrication process. The LESC is made up of polysilicon structure, having a spherical ended v-shaped cross-section. The storage node plate of the LESC is overlaid by polysilicon with a dielectric sandwiched in between and connects to an access device's active area via a buried contact. The plate extends to an adjacent storage node but is isolated from the adjacent node by less than the critical resolution dimension of a given lithographic technology. The addition of the polysilicon structure increases storage capability 50% without enlarging the surface area defined for a normal buried digit line stacked capacitor cell.

31 Claims, 11 Drawing Sheets

LATERAL EXTENSION STACKED CAPACITOR

This is a continuation-in-part to U.S. patent application No. 07/637,900, filed Jan. 4, 1991, now abandoned.

FIELD OF THE INVENTION

This invention relates to semiconductor circuit memory storage devices and more particularly to the design of dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate charge or capacitance in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continue to increase for future generations of memory devices.

The ability to densely pack storage cells while maintaining required storage capabilities is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two layers of a conductive material such as polycrystalline silicon (polysilicon or poly) are deposited over an access device on a silicon wafer with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining high dielectric breakdown characteristics between poly layers in the STC capacitor becomes a major concern once insulator thickness is appropriately scaled.

A paper submitted by T. Ema, S. Kawanago, T. Nishi, S. Yoshida, H. Nishibe, T. Yabu, Y. Kodama, T. Nakano and M. Taguchi, entitled "3-DIMENSIONAL STACKED CAPACITOR CELL FOR 16M AND 64M DRAMS," IEDM, Dig. Tech. Papers, pp. 592-595, 1988, herein incorporated by reference, discusses a 3-dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the polysilicon fins (used for a capacitor cell plate) covering the fins and filling in the gaps. This design can be fabricated using current methods and increases storage capacitance, but it is not suitable for a deep submicron (such as 0.2 micron) design rule DRAM cell because the total thickness of several fins making up the cell plate is much larger than minimum feature size. In addition, the process flow needed to realize this fin structure requires precise alignment between two adjacent word lines and digits lines. This alignment along with the requirement to have the storage node poly overlap the storage node contact leads to a larger cell area that is not suitable for 0.2 micron design rules mentioned previously.

Also, in a paper submitted by S. Inoue, K. Hieda, A. Nitayama, F. Horiguchi and F. Masuoka, entitled "A SPREAD STACKED CAPACITOR (SSC) CELL FOR 64MBIT DRAMS," IEDM, Dig. Tech. Papers, pp. 31-34, 1989, herein incorporated by reference, discusses a storage electrode of a 1st memory cell being expanded to the neighboring 2nd memory cell area.

The SSC cell fabrication process (refer to FIG. 2 pp. 32) begins with a storage electrode deposited above the digit lines that is expanded from the 1st memory cell to its adjacent memory cells and visa versa. This results in a stacked capacitor arrangement where each storage electrode can occupy two memory cell areas, thus almost doubling the storage capacitance of one memory cell.

However, the SSC process is complicated and adds at least two masks to the standard process and cannot be made with self-aligned contacts.

The present invention develops an existing stacked capacitor fabrication process to construct a 3-dimensional stacked capacitor cell by using self aligned contacts without additional photolithography steps.

SUMMARY OF THE INVENTION

The invention is directed to maximizing storage cell surface area in a high density/high volume DRAM (dynamic random access memory) fabrication process. An existing stacked capacitor fabrication process is modified to construct a 3-dimensional lateral extension stacked capacitor (LESC) defined as a storage cell.

After a silicon wafer is prepared using conventional process steps, the present invention develops the LESC by creating a v-shaped poly structure having laterally extending polysilicon conforming to the topology formed by three adjacent word lines running perpendicular to two adjacent digit lines, which results in increased capacitor plate surface area for each storage cell. Such a structure has the potential to increase the capacitance of a conventional STC cell by 40 to 50% or more.

DETAILED DESCRIPTION OF THE PREFERRED EMBODIMENT

The invention is directed to maximizing storage cell surface area in a high density/high volume DRAM fabrication process, in a sequence shown in FIGS. 1-9b. A silicon wafer is prepared using conventional process steps up to the point of defining a cell array. Capacitor fabrication will now follow.

The capacitor of each cell will make contact with a buried contact within the cell, while the capacitor will extend to the active area of an adjacent cell. Each active area within the array is isolated from one another by a thick field oxide and arranged in interdigitated columns and non-interdigitated rows. The active areas are used to form active MOS transistors that can be doped as NMOS or PMOS type FETs depending on the desired use.

Figure 1:
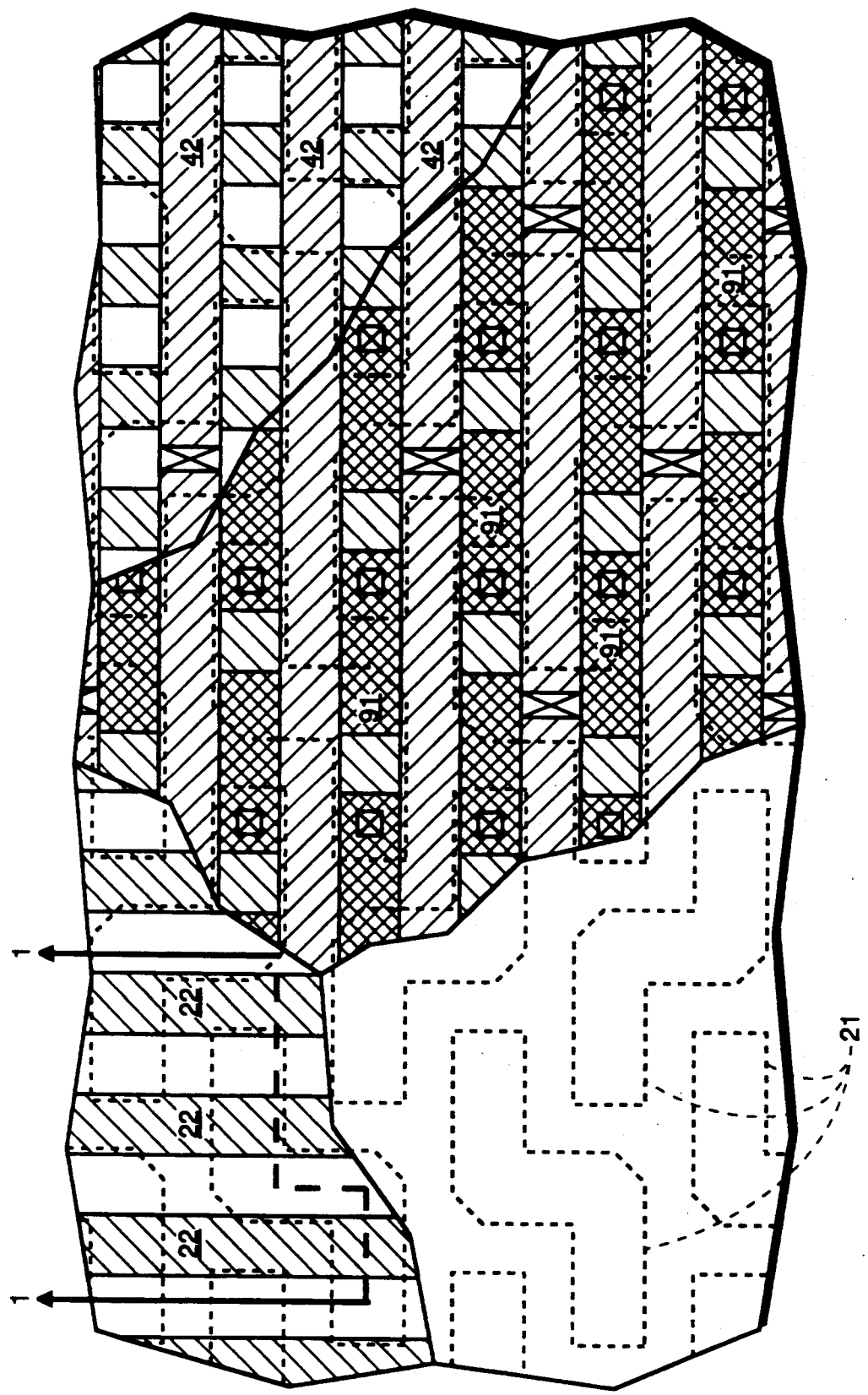
FIG. 1 is a top planar view of a portion of an in-process wafer showing digit lines, word lines, active areas and storage capacitors.

FIG. 1 shows a top planar view portion of a completed multilayered memory array with the main building blocks comprising digit lines 42, word lines 22, active areas 21, and LESC storage node plates 91. Active areas 21 have been implanted in such a manner as to have each adjacent active area interweave with one another in the row direction (or word line direction) thereby forming parallel interdigitated rows of active areas 21. In the column direction (or digit line direction) each adjacent active area 21 run end to end thereby forming parallel noninterdigitated columns of active area. The stacked capacitor structure of the preferred embodiment (the LESC) is self-aligned to word lines 22 as well as to digit lines 42.

Figure 2:
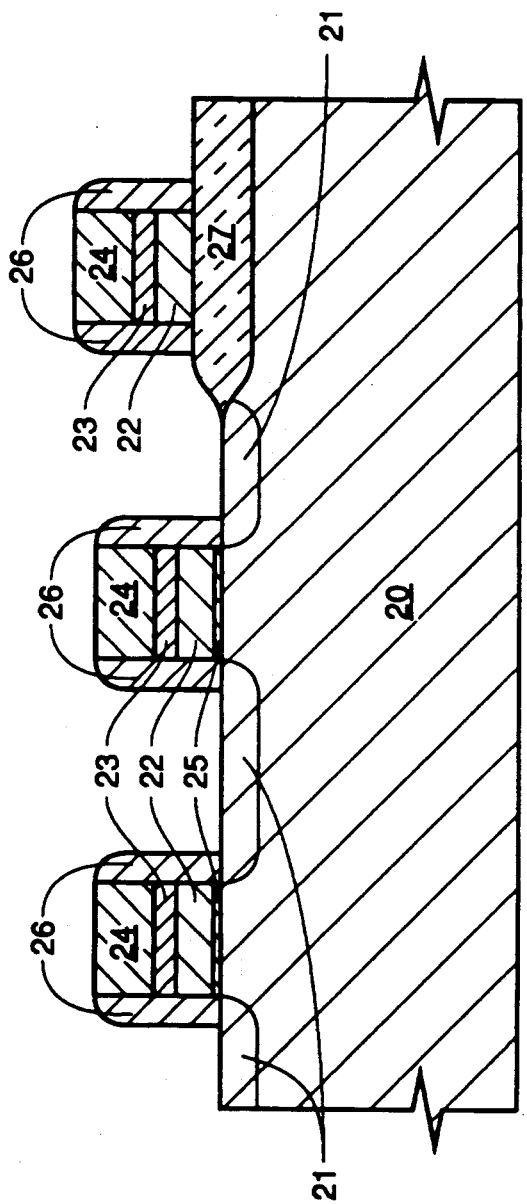
FIG. 2 is a cross-sectional view through broken line 1—1 of FIG. 1.

As shown in FIG. 2, parallel poly word lines 22, covered with silicide 23 and dielectric 24 (either oxide or nitride) and further isolated from subsequent conductive layers by dielectric spacers 26 (either oxide or nitride), have been previously deposited over a thin layer of gate oxide 25 or a thick layer of field oxide 27. Active areas 21 have been appropriately doped to a desired conductivity type which penetrates into the bulk silicon wafer 20, by conventional process steps. Now the wafer is ready for digit line formation that will run perpendicular to and over the top of word lines 22.

Figure 3:
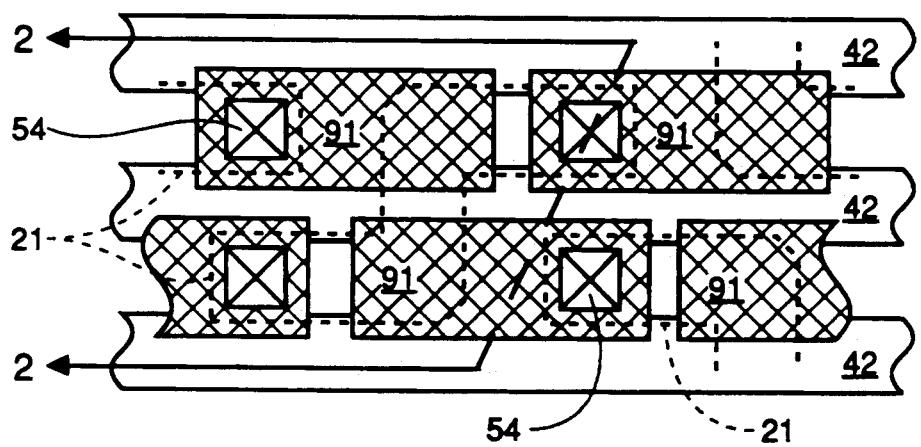
FIG. 3 is a top planar view of a portion of an in-process wafer showing digit lines, storage node contacts and storage capacitors.

FIG. 3 shows a top planar view of a portion of an in-process wafer showing active areas 21, digit lines 42, storage node contacts 54 and storage node plates 91.

Figure 4:
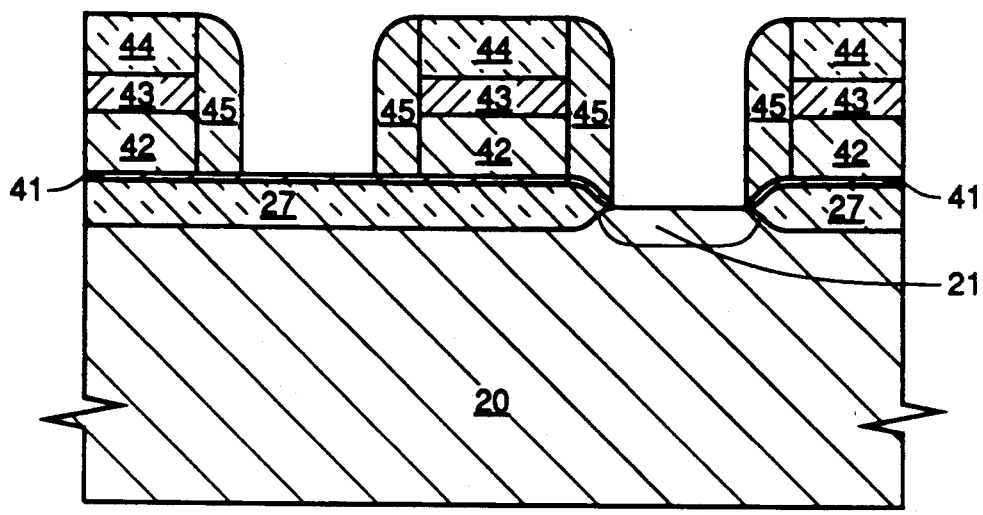
FIG. 4 is a cross-sectional view of the in-process wafer through broken line 2—2 of FIG. 3 following deposition and etching of digit line vertical dielectric spacers.

As shown in FIG. 4, an oxide layer 41 is deposited over the entire wafer array surface followed by buried digit line contacts patterning and etch. Blanket depositions of polysilicon 42, silicide 43 and dielectric 44, are performed respectively. Dielectric 44 can be either nitride or oxide and is deposited by chemical vapor deposition CVD) which is preferred for its excellent conformity. The layers of polysilicon 42, silicide 43 and dielectric 44 are patterned and etched with polysilicon 42, previously being conductively doped, in conjunction with silicide 43 to serve as parallel digit lines 42 covered with dielectric layer 44. Digit lines 42 run perpendicular to word lines 22 (shown in FIG. 2) and conform to the wafer surface resulting in a waveform-like topology running in both the digit line and word line directions. A second dielectric 45, such as nitride or oxide is now deposited, followed by an anisotropic etch to form vertical dielectric spacers 45.

Figure 5:
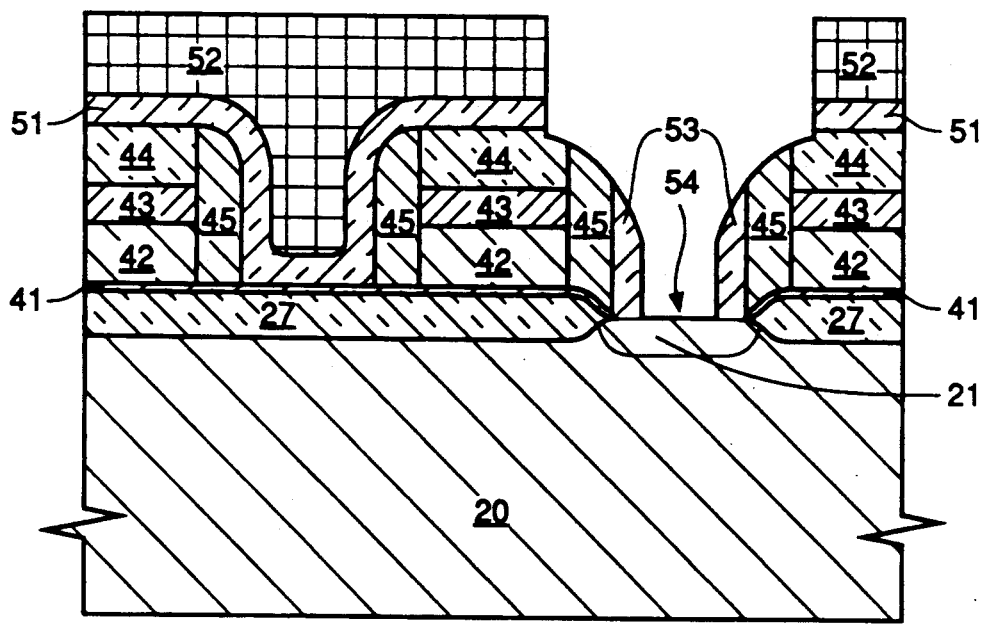
FIG. 5 is a cross-sectional view of the in-process wafer portion of FIG. 4 after conformal dielectric deposition, followed by a buried contact photo and etch.

As shown in FIG. 5, digit lines 42 and their subsequent isolation layers are then covered with a dielectric 51 that is also either oxide or nitride, to a preferred thickness of 500 to 2000 angstroms, preferably deposited by CVD. Subsequently, a buried contact 54, self-aligned to digit lines 42 by the presence of spacers 45, is located by covering all areas other than contact 54 location with photoresist 52. After applying an appropriate photomask, a buried contact anisotropic etch on the exposed dielectric creates additional spacers 53 and provides an opening to locate contact 54.

Up to this point, process flow has followed that of an array comprising conventional stacked capacitor cells. From this point forward, the process is unique to an array having LESC-type storage capacitors.

Figure 6:
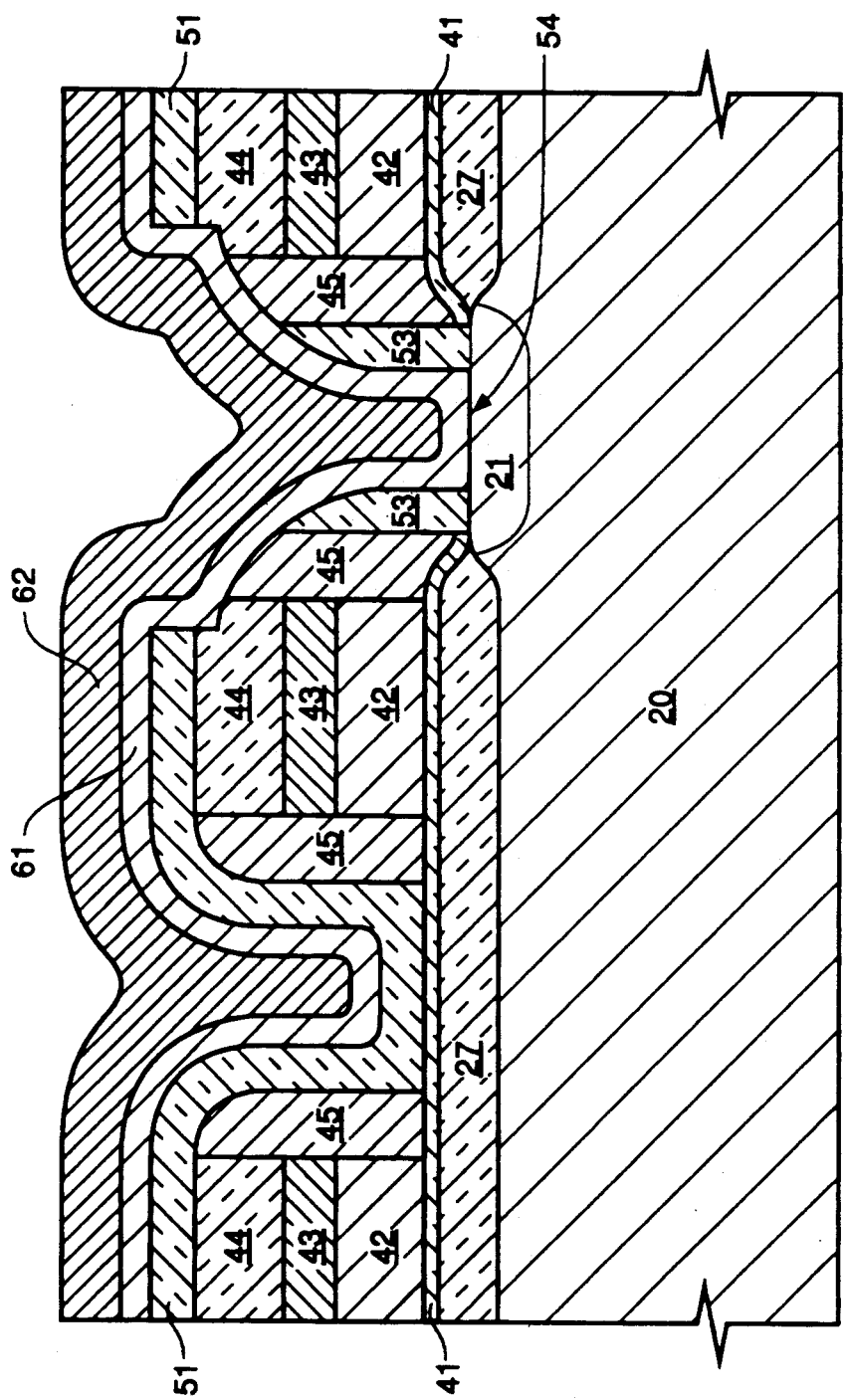
FIG. 6 is a cross-sectional view of the in-process wafer portion of FIG. 5 following a photoresist strip, a blanket deposition of conformal poly, poly doping and a blanket deposition of nitride.

As shown in FIG. 6, the photoresist 52 (of FIG. 5) has been stripped and a conformal poly layer 61 is deposited, preferably by low temperature deposition, over the entire array surface and couples to active area 21 via buried contact 54. Using low temperature deposition causes poly layer 61 to have a rugged textured surface that potentially doubling its surface area. Following poly 61 deposition and doping a conformal layer of nitride 62 is deposited, preferably by CVD.

Figure 7A:
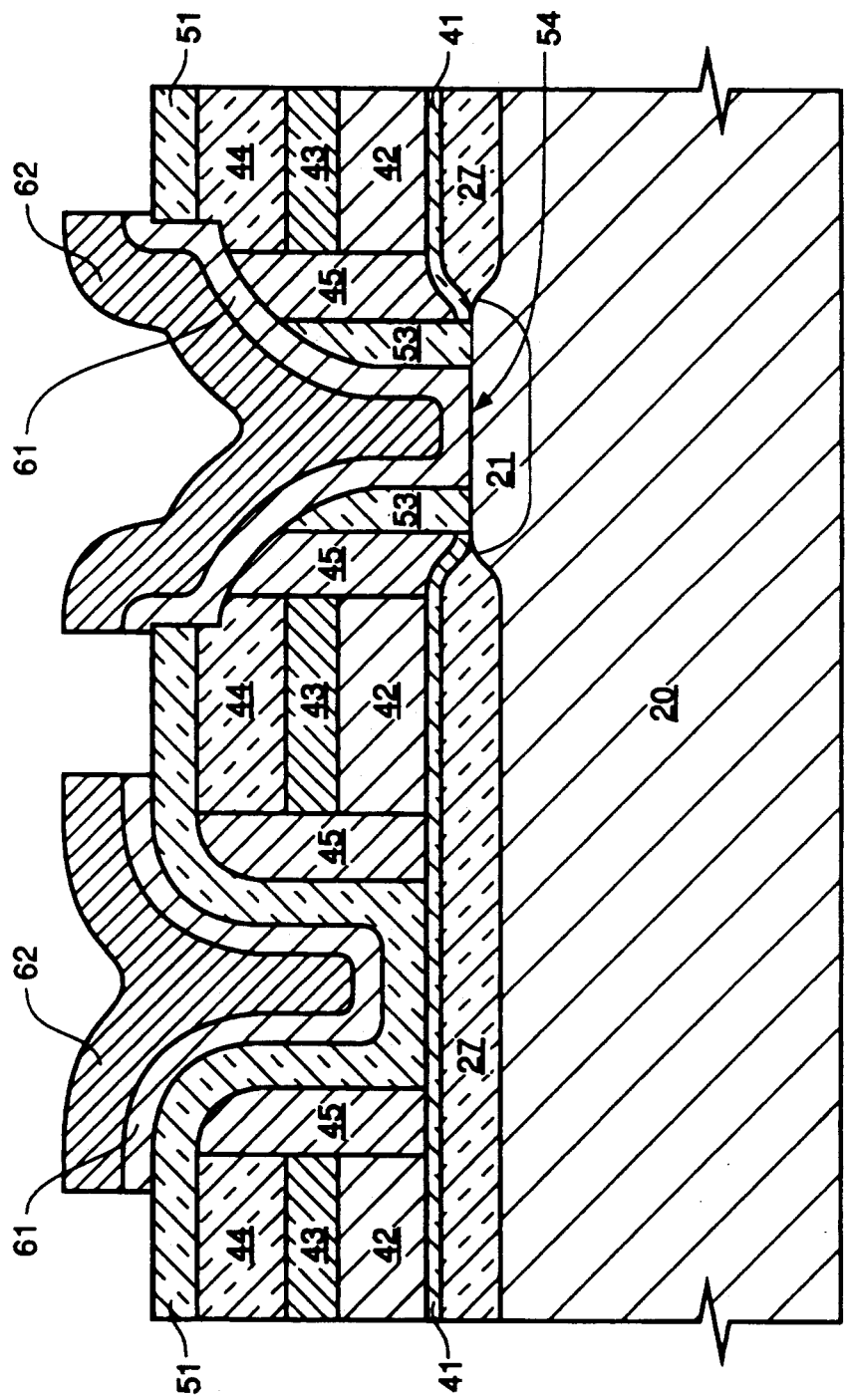
FIG. 7a is a cross-sectional view of the in-process wafer portion of FIG. 6 following patterning of a dielectric and a poly storage node, respectively.
Figure 7B:
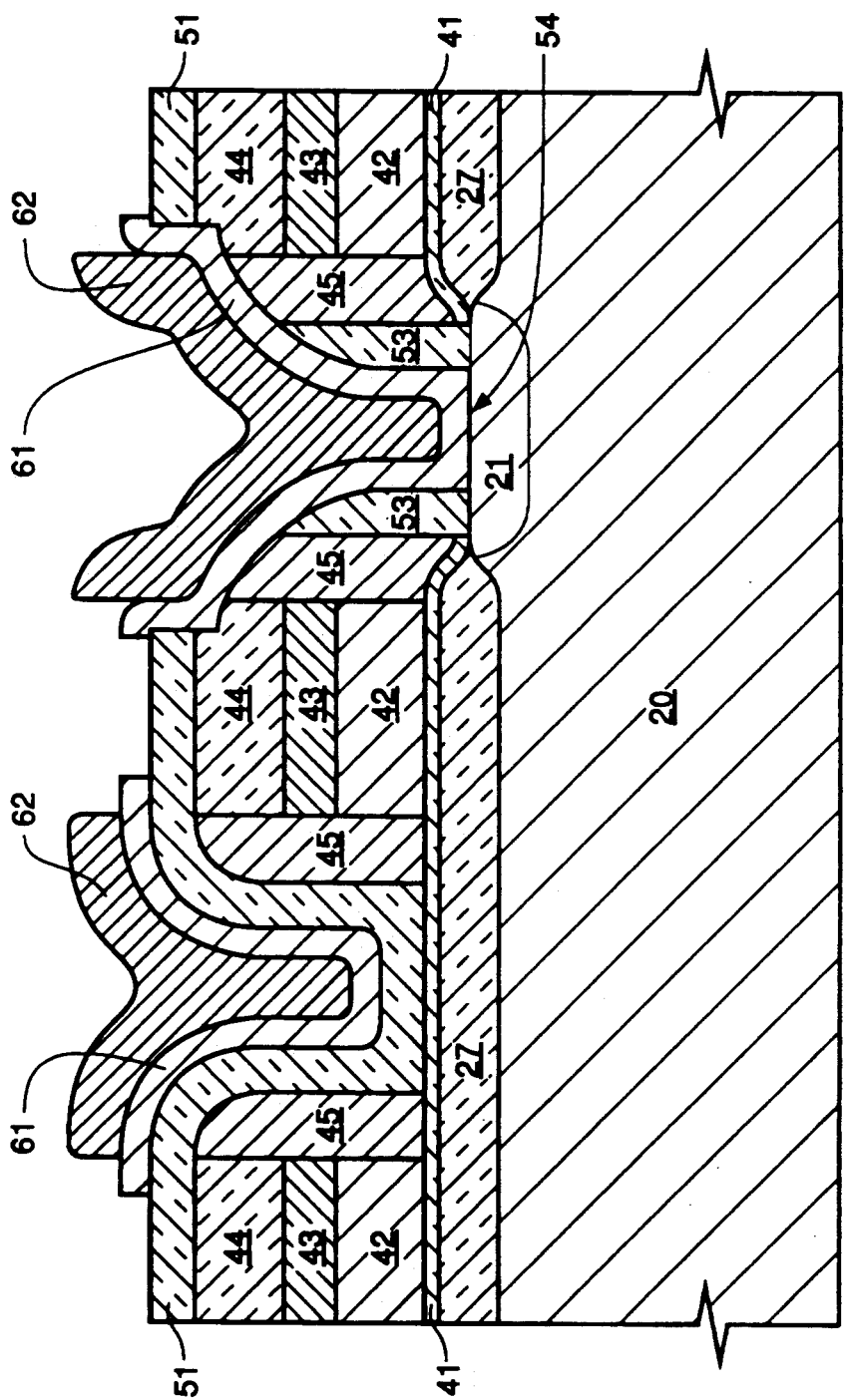
FIG. 7b is a cross-sectional view of the in-process wafer portion of FIG. 7a following patterning of a dielectric and a poly storage node, respectively.

As shown in FIG. 7a, poly layer 61 and nitride 62 are patterned to serve as a portion of a storage node plate of the LESC storage cell. Poly plate 61 extends over an adjacent poly word line (the word line is not shown as it runs parallel to the cross-sectional view of FIG. 7a) and continues to the next adjacent word line. Plate 61 conforms to the two perpendicular waveform-like topology (created after digit line formation) which run in both the word lines and the digit lines directions. As shown in FIG. 7b, an additional partial nitride isotropic etch (either a wet or dry etch) can be performed on nitride 62 thereby exposing a portion of patterned poly 61. This etch is not necessary to achieve the present invention, however it will enhance the poly storage node area that has yet to be completed.

Figure 8A:
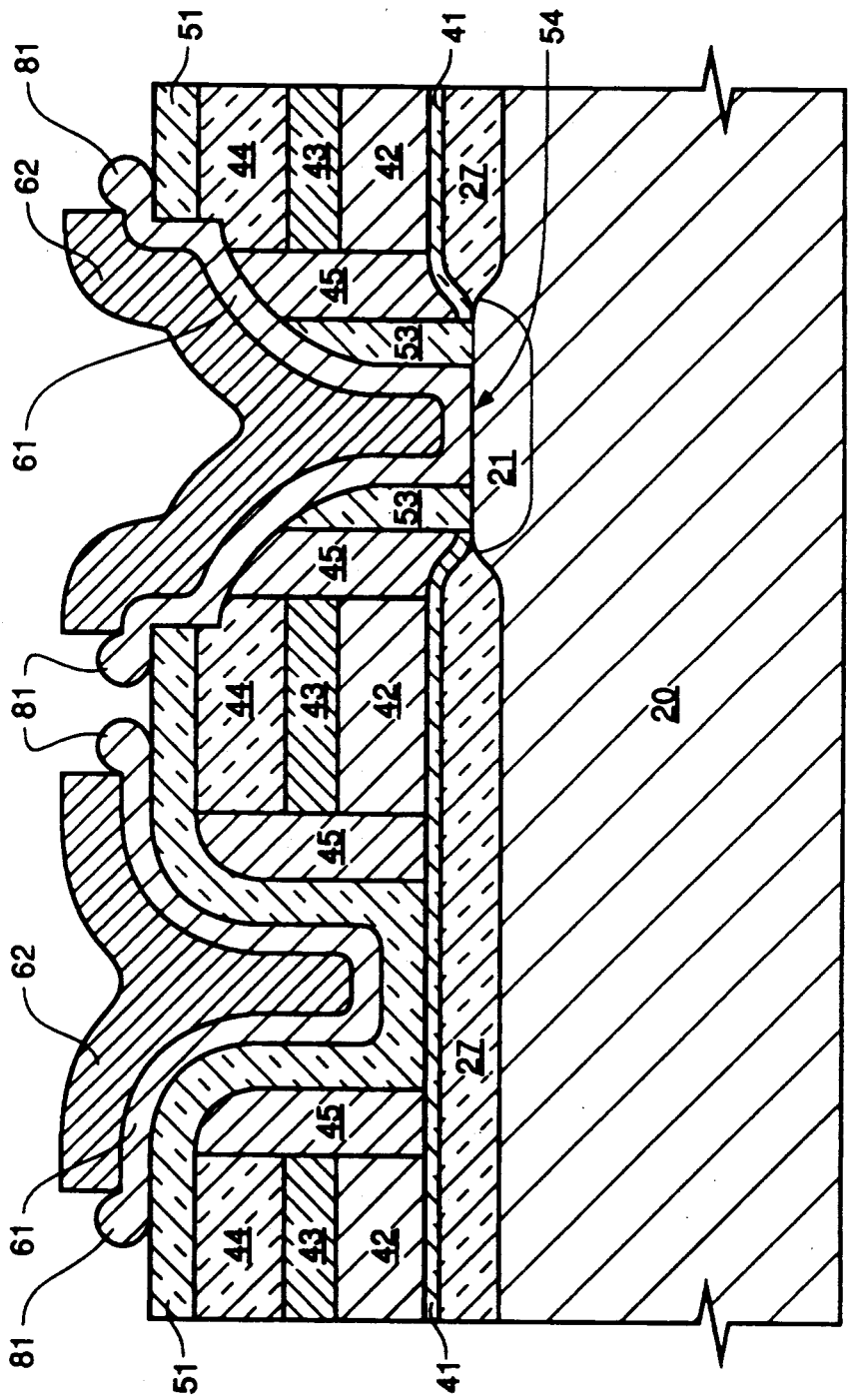
FIGS. 8a and 8b are cross-sectional views of the in-process wafer portion of FIGS. 7a and 7b, respectively, after a selective lateral growth of poly.
Figure 8B:
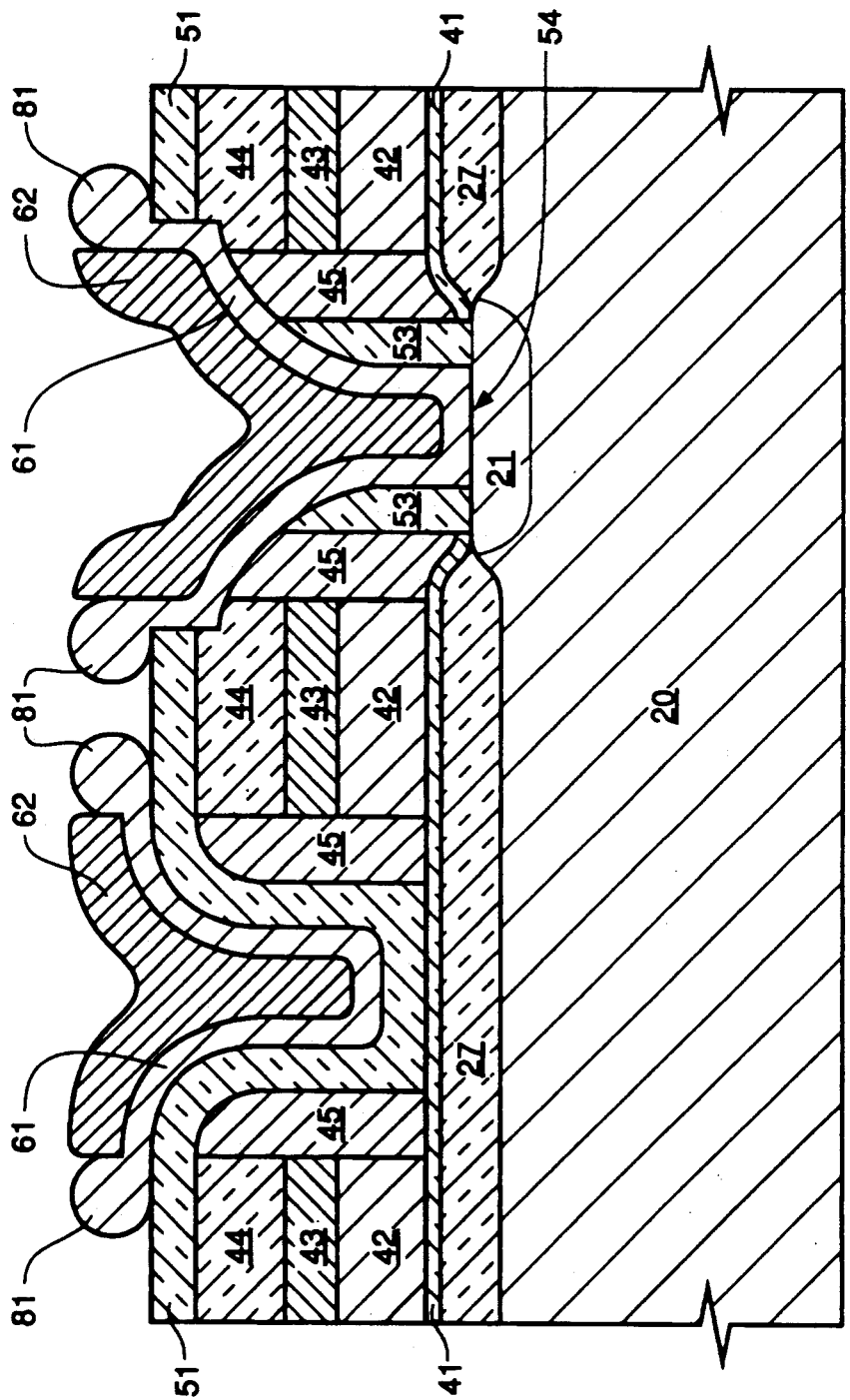

As shown in FIGS. 8a and 8b, selective polysilicon of poly 81 is laterally grown increasing the poly surface area by extending poly 61. FIG. 8a represents the expected lateral growth of poly 81 following patterning of a storage plate (FIG. 7a), while FIG. 8b represents a greater lateral growth of poly 81 that follows the partial nitride isotropic etch described earlier concerning FIG. 7b.

Figure 9A:
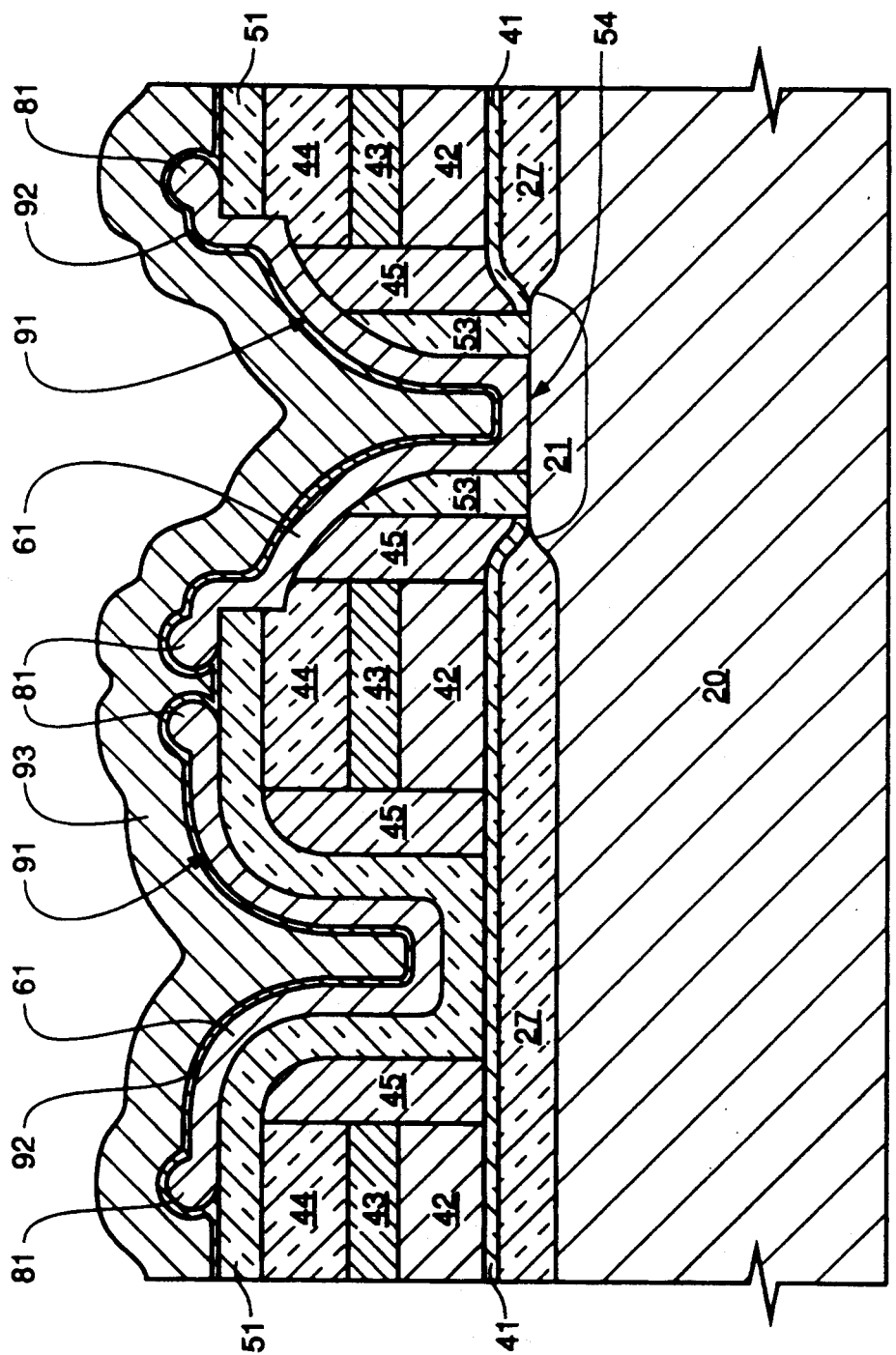
FIGS. 9a and 9b are cross-sectional views of the in-process wafer portion of FIGS. 8a and 8b, respectively, following a nitride etch and blanket depositions of conformal nitride and poly.
Figure 9B:
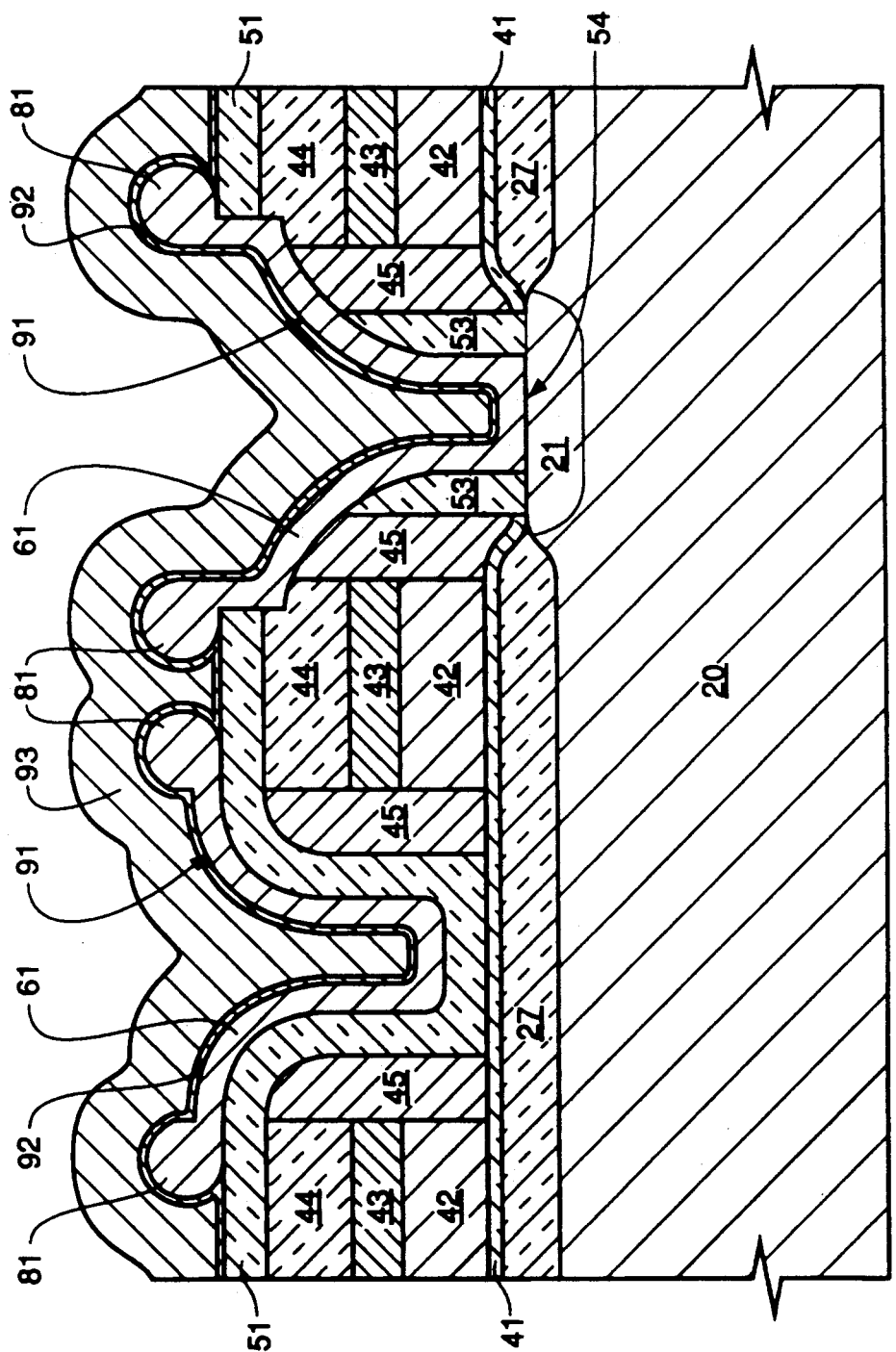

As shown in FIGS. 9a and 9b, nitride 62 (FIGS. 8a and 8b) have been etched away. The laterally grown poly 81 takes on a spherical shape attaching to the ends the v-shaped cross-sectional view of poly 61 thereby forming a spherically ended v-shaped poly structure 91 to serve as a completed storage node plate for the LESC cell. The size of this spherical shape can be controlled to enhance the overall surface area of the poly storage node. Also shown in FIGS. 9a and 9b, a dielectric layer of nitride 92 is deposited that conforms to poly structure 91. Nitride 92 can also be slightly oxidized to form a highly reliable oxide/nitride composite dielectric or it can be replaced by any high dielectric constant material such as $Ta_2O_5$, $SrTiO_3$, etc. to serve as a capacitor dielectric for the LESC cell. Following nitride 92 deposition, a blanket deposition of conformal poly 93 is deposited. Poly structure 91 and poly 93 are conductively doped either n-type or p-type depending on the conductivity type desired for active area 21. Poly 93 now serves as a top poly capacitor cell plate of the LESC storage cell which also becomes a common cell plate to all LSC storage capacitors in the array.

With the formation of poly plate 91 substantial capacitor plate surface area is gained at the storage node. Since capacitance is mainly effected by the surface area of a capacitor's cell plates the additional area gained by a 3-dimensional LESC structure of spherical ended v-shaped cross-section can provide an additional 50% or more increase in capacitance over that of a conventional STC capacitor, without more space than that required for defining a stacked capacitor storage cell. In fact, the capacitance gained depends directly on the amount of selective polysilicon lateral growth allowed while maintaining sufficient isolation from an adjacent storage node. Also due to the lateral growth, spacing between adjacent storage nodes can be less than the critical resolution dimension of a given lithographic technology. Higher density for a given capacitance is also possible as a smaller cell area is achieved.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a DRAM array on a silicon substrate, said process comprising the steps of:
    creating a plurality of separately isolated active areas arranged in parallel rows and parallel columns;
    creating a gate dielectric layer on top of each active area;
    depositing a first conductive layer superjacent surface of said array;
    depositing a first dielectric layer superjacent said first conductive layer;
    masking and etching said first conductive and said first dielectric layers to form a plurality of parallel conductive word lines aligned along said rows such that each word line passes over a inner portion of each said active area being separated therefrom by a remanent of said gate dielectric layer;
    creating of a conductively-doped line junction and storage node junction within each said active area on opposite sides of each said word line;
    forming first dielectric spacers adjacent vertical edges of patterned word lines;
    depositing a second dielectric layer superjacent said array surface;
    creating a first aligned buried contact location at each said digit line junction in each said active area;
    depositing a second conductive layer superjacent said array surface, said second conductive layer making direct contact to said digit line junctions at said first buried contact locations;
    depositing a third dielectric layer superjacent to said second conductive layer;
    masking and etching said second conductive layer and said third dielectric layer to form a plurality of parallel conductive digit lines aligned along said columns such that a digit line makes electrical contact at each digit line junction within a column, said digit lines running perpendicular to and over said word lines forming a 3-dimensional, waveform-like topology;
    forming second dielectric spacers adjacent vertical edges of patterned digit lines;
    depositing a first oxide layer superjacent said array surface of said waveform-like topology;
    creating a second aligned buried contact location at each said storage node junction in each said active area;
    depositing a third conductive layer superjacent said array surface assuming said waveform-like topology in response to existing topology, said third conductive layer making contact to said storage node junctions at said second buried contact locations;
    depositing a fourth dielectric layer;
    patterning said third conductive layer and said fourth dielectric layer to form a portion of a storage node plate at each said storage node junction, said storage node plate having a v-shaped cross-section;
    laterally growing a conductive sphere, said conductive sphere layer attaching to said third conductive layer thereby forming a completed storage node plate having a spherical ended v-shaped cross-section;
    isotropically etching said fourth dielectric layer;
    depositing a cell dielectric layer adjacent and coextensive with said storage node plate and adjacent said array surface; and
    depositing a fourth conductive layer adjacent to and coextensive with said cell dielectric layer to form a cell plate common to the entire memory array.

2. A process as recited in claim 1, wherein said gate dielectric layer is oxide.

3. A process as recited in claim 1, wherein said first and said second conductive layers comprise a layer of tungsten silicide and doped polysilicon.

4. A process as recited in claim 1, wherein said first and said second dielectric layers are selected from the group consisting essentially of oxide or nitride.

5. A process as recited in claim 1, wherein said third dielectric layer is oxide.

6. A process as recited in claim 1, wherein said first and said second buried contacts are self aligned.

7. A process as recited in claim 1, wherein said third and said fourth conductive layers are doped polysilicon.

8. A process as recited in claim 7, wherein said third conductive layer is deposited by low temperature deposition.

9. A process as recited in claim 1, wherein said second, said third, and said fourth dielectric layers are deposited by chemical vapor deposition.

10. A process as recited in claim 1, wherein said fourth dielectric layer is nitride.

11. A process as recited in claim 1, wherein said cell dielectric layer is nitride.

12. A process as recited in claim 1, wherein said patterning of said fourth dielectric layer includes a storage node etch step followed by a partial nitride isotropic etch step.

13. A process as recited in claim 1, wherein said laterally growing a conductive sphere comprises laterally growing a conductively doped polysilicon sphere.

14. A process for fabricating a storage capacitor on a silicon substrate, said process comprising the steps of:
   creating an aligned buried contact location to an underlying conductive area thereby forming a storage node junction;
   depositing a first conductive layer superjacent the surface of the material residing on said silicon substrate, said first conductive layer making contact to said conductive area at said storage node junction;
   depositing a dielectric layer;
   patterning said first conductive layer and said dielectric layer to form a portion of a storage node plate at said storage node junction, said storage node plate having a v-shaped cross-section; laterally growing a conductive sphere, said conductive sphere attaching to said first conductive layer thereby forming a completed storage node plate having a spherical ended v-shaped cross-section, said storage node plate serving as a first capacitor electrode;
   isotropically etching said dielectric layer;
   depositing a cell dielectric layer adjacent and coextensive with said storage node plate; and
   depositing a second conductive layer adjacent to and coextensive with said cell dielectric layer to form a second capacitor electrode.

15. A process as recited in claim 14, wherein said buried contact is self aligned.

16. A process as recited in claim 14, wherein said conductive area is an active area.

17. A process as recited in claim 14, wherein said conductive sphere is laterally grown, conductively doped polysilicon sphere.

18. A process as recited in claim 14, wherein said first and second conductive layers are doped polysilicon.

19. A process as recited in claim 17, wherein said first conductive layer is deposited by low temperature deposition.

20. A process as recited in claim 14, wherein said dielectric layer is deposited by chemical vapor deposition.

21. A process as recited in claim 14, wherein said dielectric layer is nitride.

22. A process as recited in claim 14, wherein said cell dielectric layer is nitride.

23. A process as recited in claim 14, wherein said patterning of said dielectric layer includes a storage node etch step followed by a partial nitride isotropic etch step.

24. A process for fabricating a storage capacitor on a silicon substrate, said process comprising the steps of:
   creating an aligned buried contact location to an underlying conductive area thereby forming a storage node junction;
   depositing a first conductively doped polysilicon layer superjacent the surface of the material residing on said silicon substrate, said first conductively doped polysilicon layer making contact to said conductive area at said storage node junction;
   depositing a dielectric layer;
   patterning said first conductively doped polysilicon layer and said dielectric layer to form a portion of a storage node plate at said storage node junction, said storage node plate having a v-shaped cross-section;
   laterally growing a conductively doped polysilicon sphere, said conductively doped polysilicon sphere attaching to said first conductively doped polysilicon layer thereby forming a completed storage node plate having a spherical ended v-shaped cross-section, said storage node plate serving as a first capacitor electrode;
   isotropically etching said dielectric layer;
   depositing a cell dielectric layer adjacent and coextensive with said storage node plate; and
   depositing a second conductively doped polysilicon layer adjacent to and coextensive with said cell dielectric layer to form a second capacitor electrode.

25. A process as recited in claim 24, wherein said buried contact is self aligned.

26. A process as recited in claim 24, wherein said conductive area is an active area.

27. A process as recited in claim 24, wherein said first conductively doped polysilicon layer is deposited by low temperature deposition.

28. A process as recited in claim 24, wherein said dielectric layer is deposited by chemical vapor deposition.

29. A process as recited in claim 24, wherein said dielectric layer is nitride.

30. A process as recited in claim 24, wherein said cell dielectric layer is nitride.

31. A process as recited in claim 24, wherein said patterning of said dielectric layer includes a storage node etch step followed by a partial nitride isotropic etch step.

* * * * *